United States Patent
Likhanskii et al.

(10) Patent No.: US 9,230,773 B1
(45) Date of Patent: Jan. 5, 2016

(54) ION BEAM UNIFORMITY CONTROL

(71) Applicant: Varian Semiconductor Equipment Associates, Inc., Gloucester, MA (US)

(72) Inventors: Alexandre Likhanskii, Malden, MA (US); Svetlana B. Radovanov, Brookline, MA (US); Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/516,032

(22) Filed: Oct. 16, 2014

(51) Int. Cl.
  *H01J 37/00* (2006.01)
  *H01J 27/02* (2006.01)
  *H01J 27/16* (2006.01)

(52) U.S. Cl.
  CPC .............. *H01J 27/024* (2013.01); *H01J 27/16* (2013.01)

(58) Field of Classification Search
  USPC ..................................................... 250/423 R
  See application file for complete search history.

(56) References Cited

U.S. PATENT DOCUMENTS

| | | | | |
|---|---|---|---|---|
| 7,453,059 | B2* | 11/2008 | Koo | H01J 37/32422 250/286 |
| 7,629,589 | B2* | 12/2009 | Hwang | H01J 27/024 250/396 R |
| 8,698,400 | B2* | 4/2014 | Scherer | H01J 27/16 315/111.21 |
| 2012/0104274 | A1* | 5/2012 | Hirayanagi | B82Y 10/00 250/424 |
| 2015/0179409 | A1* | 6/2015 | Biloiu | H01J 37/32357 216/66 |

OTHER PUBLICATIONS

Costel Biloiu, In Situ Control of Ion Angular Distribution in a Processing Apparatus, U.S. Appl. No. 14/139,679, filed Dec. 23, 2013.

* cited by examiner

*Primary Examiner* — Phillip A Johnston

(57) ABSTRACT

A plasma chamber having improved controllability of the ion density of the extracted ribbon ion beam is disclosed. A plurality of pairs of RF biased electrodes is disposed on opposite sides of the extraction aperture in a plasma chamber. In some embodiments, one of each pair of RF biased electrodes is biased at the extraction voltage, while the other of each pair is coupled to a RF bias power supply, which provides a RF voltage having a DC component and an AC component. In another embodiment, both of the electrodes in each pair are coupled to a RF biased power supply. A blocker may be disposed in the plasma chamber near the extraction aperture. In some embodiments, RF biased electrodes are disposed on the blocker.

11 Claims, 8 Drawing Sheets

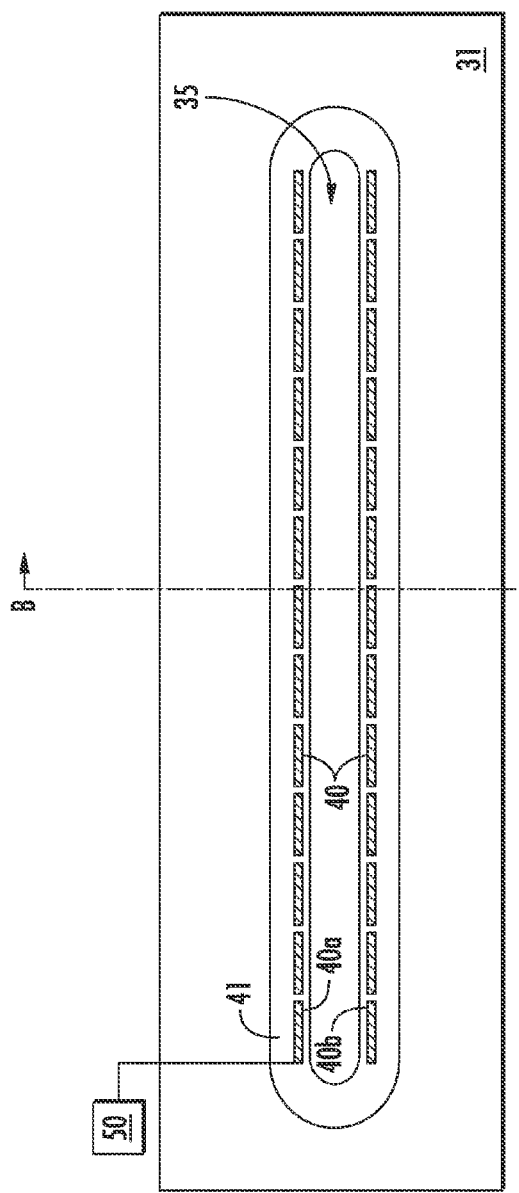
FIG. 2A
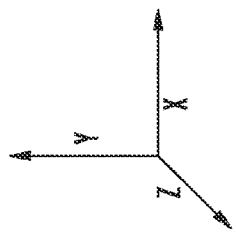
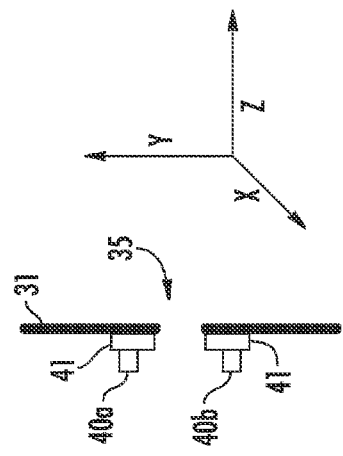
FIG. 2B

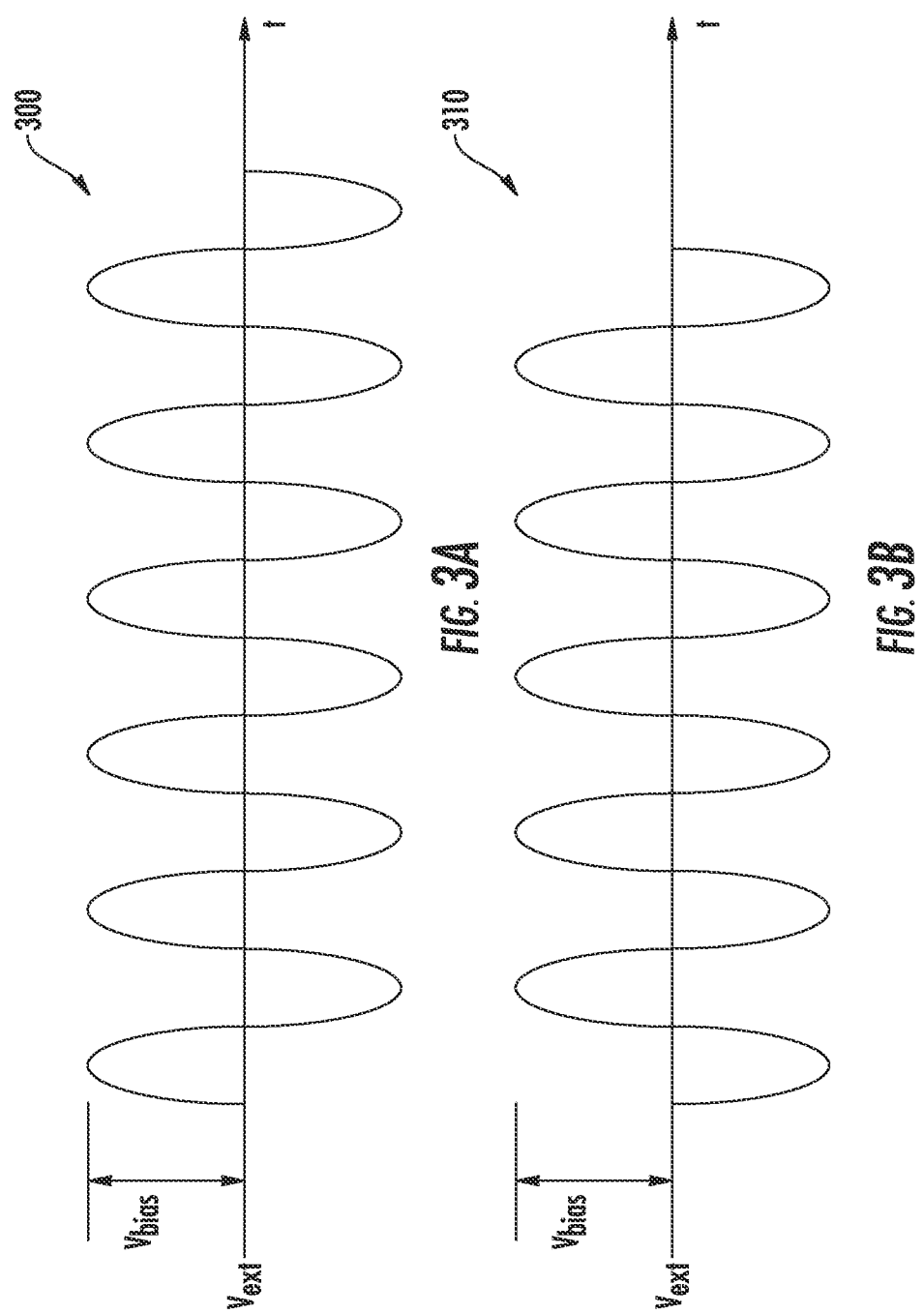

… (1)

ION BEAM UNIFORMITY CONTROL

FIELD

Embodiments of this disclosure are directed to systems for controlling ion beam uniformity, and more particularly for controlling uniformity of an extracted ribbon ion beam.

BACKGROUND

Plasma chambers are often used to generate a plasma. Ions from this plasma are then extracted from the plasma chamber through an aperture to form an ion beam. This plasma may be generated in various ways. In one embodiment, an antenna is disposed outside the plasma chamber, proximate to a dielectric window. The antenna is then excited using an RF power supply. The electromagnetic energy generated by the antenna then passes through the dielectric window to excite feed gas disposed within the plasma chamber.

The plasma that is generated is then extracted through an extraction aperture. In some embodiments, the extraction aperture may be rectangular or oval, where the length is much larger than the width of the opening. However, in these embodiments, the ion beam that is extracted from the plasma chamber may not be of the desired uniformity across the length of extraction aperture. For example, the plasma density may be greater near the center of the plasma chamber and may be reduced in regions away from the center.

This plasma non-uniformity may affect the extracted ion beam. For example, rather than extracting an ion beam having a constant ion density across its width, the ion beam may have a greater concentration of ions in a first portion, such as near the center, than in a second portion, such as at its ends. In other embodiments, it may be desirable to create an ion beam having a known non-uniformity.

Therefore, it would be beneficial if there were an improved system for extracting an ion beam from a plasma chamber. More particularly, it would be advantageous to more finely control the uniformity of a ribbon ion beam that is being extracted from a plasma chamber.

SUMMARY

A plasma chamber having improved controllability of the ion density of the extracted ribbon ion beam is disclosed. A plurality of pairs of RF biased electrodes is disposed on opposite sides of the extraction aperture in a plasma chamber. In some embodiments, one of each pair of RF biased electrodes is biased at the extraction voltage, while the other of each pair is coupled to a RF bias power supply, which provides a RF voltage having a DC component and an AC component. In another embodiment, both of the electrodes in each pair are coupled to a RF biased power supply. A blocker may be disposed in the plasma chamber near the extraction aperture. In some embodiments, RF biased electrodes may be disposed on the blocker.

According to one embodiment, a plasma chamber is disclosed. The plasma chamber comprises a power source to generate a plasma within the plasma chamber, a chamber wall having an extraction aperture through which ions from the plasma are extracted, where the chamber wall is biased at an extraction voltage, a pair of RF biased electrodes disposed on an interior of the chamber wall on opposite sides of the extraction aperture, and a RF bias power supply to supply a first RF voltage to a first of the pair of RF biased electrodes. According to a second embodiment, a plasma chamber is disclosed. The plasma chamber comprises an inductively coupled plasma source to generate a plasma within the plasma chamber, a chamber wall having an extraction aperture through which ions from the plasma are extracted, and a plurality of capacitively coupled plasma sources disposed proximate the extraction aperture. According to a third embodiment, a plasma chamber is disclosed. The plasma chamber comprises a power source to generate a plasma within the plasma chamber, a chamber wall having an extraction aperture through which ions from the plasma are extracted, where the chamber wall is biased at an extraction voltage, a blocker disposed within the plasma chamber proximate the extraction aperture, biased at the extraction voltage, a RF biased electrode disposed on the blocker, and a RF bias power supply to supply a RF voltage to the RF biased electrode.

BRIEF DESCRIPTION OF THE FIGURES

For a better understanding of the present disclosure, reference is made to the accompanying drawings, which are incorporated herein by reference and in which:

FIG. 2A shows a cross section of the plasma chamber of FIG. 1 taken along line AA according to one embodiment;

FIG. 2B shows a cross section of the extraction aperture of FIG. 2A taken along line BB;

FIGS. 3A-3B show representative voltage waveforms that may be applied to a pair of RF biased electrodes;

DETAILED DESCRIPTION

A system of controlling ion beam uniformity using RF biased electrodes disposed proximate the extraction aperture of the plasma chamber is disclosed. These RF biased electrodes may create changing electrical fields, which may cause additional ions to be created in the region proximate the electrodes. In other words, by RF biasing electrodes near the extraction aperture, greater plasma density may be created in localized regions. In some embodiments, a plurality of RF biased electrodes are disposed proximate the extraction aperture to allow fine tuning and localized control of the ion density of the extracted ribbon ion beam along its length.

Figure 1:
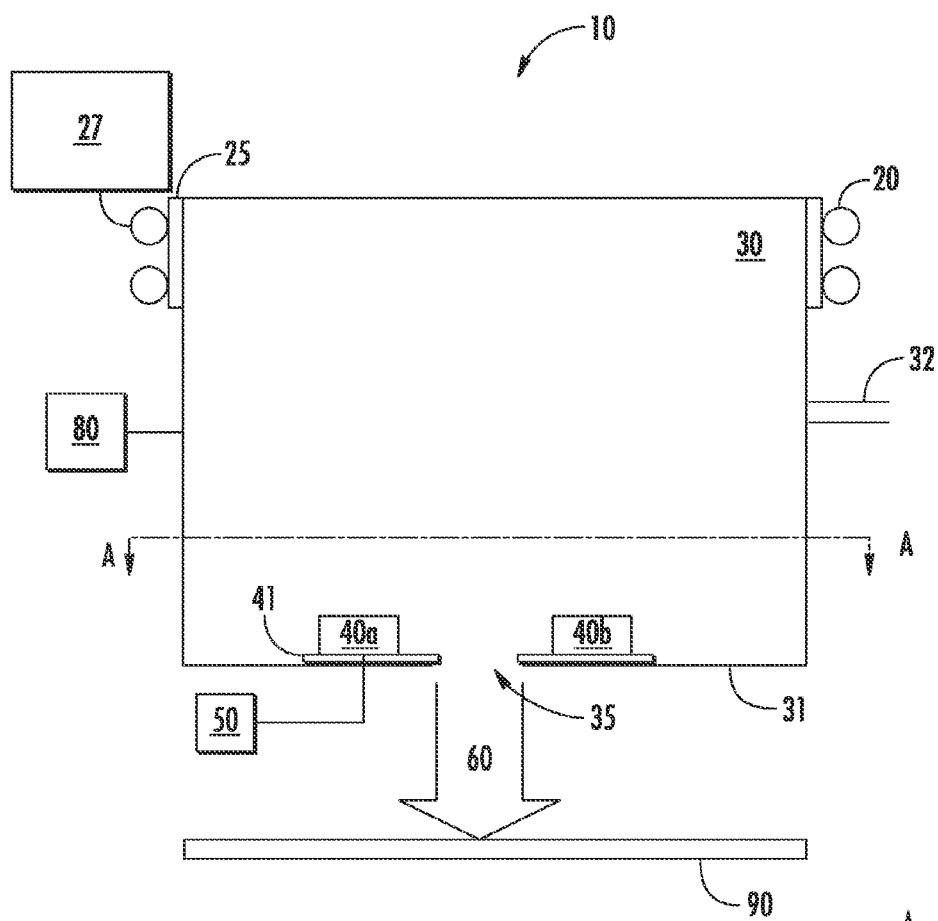
FIG. 1 shows a side view of a first embodiment of a plasma chamber where electrodes are disposed near the extraction aperture.

FIG. 1 shows a first embodiment of the system 10 for controlling ion beam uniformity. An antenna 20 may be disposed external to a plasma chamber 30, proximate a dielectric window 25. The antenna 20 is electrically connected to a RF power supply 27, which supplies an alternating voltage to the antenna 20. The voltage may be at a frequency of, for example, 2 MHz or more. While FIG. 1 shows the dielectric window 25 and the antenna 20 disposed about the chamber sidewalls of the plasma chamber 30, the disclosure is not limited to this embodiment. For example, the dielectric window 25 and the antenna 20 may be disposed on the top of the plasma chamber 30, on the wall opposite the chamber wall 31 with the extraction aperture 35.

The chamber walls of the plasma chamber 30 may be made of a conductive material, such as graphite. These chamber walls may be biased at an extraction voltage ($V_{ext}$), such as by extraction power supply 80. The extraction voltage may be, for example, 1 kV, although other voltages are within the scope of the disclosure.

FIG. 2A shows the system 10 of FIG. 1 in cross-section taken along line AA according to a first embodiment. Chamber wall 31 of the plasma chamber 30 has an extraction aperture 35 through which ions from the plasma may be extracted. In some embodiments, the extraction aperture 35 may be rectangular or oval, where the length of the opening is much larger than the width of the opening. For example, the length of the extraction aperture 35 may be about 30 cm, while its width is typically less than 1 cm. Again, these dimensions are only illustrative and other dimensions may also be used.

Referring back to FIG. 1, a workpiece 90 is disposed proximate and outside the chamber wall 31 having the extraction aperture 35 of the plasma chamber 30. In some embodiments, the workpiece 90 may be within about 1 cm of the chamber wall 31, although other distances are also possible. In operation, the antenna 20 is powered using a RF signal so as to inductively couple energy into the plasma chamber 30. This inductively coupled energy excites the feed gas introduced via gas inlet 32, thus generating a plasma. Since the chamber walls of the plasma chamber 30 are positively biased at $V_{ext}$, the plasma within the plasma chamber 30 is likewise positively biased.

The workpiece 90, which may be grounded, is disposed proximate the chamber wall 31 having the extraction aperture 35. The difference in potential between the plasma and the workpiece causes positively charged ions in the plasma to be accelerated through the extraction aperture 35 in the form of an extracted ribbon ion beam 60 and toward the workpiece 90. In other embodiments, an electrode, or a set of electrodes (not shown), may be disposed between the chamber wall 31 and the workpiece 90. This electrode or set of electrodes may be more negatively biased than the chamber walls, causing positive ions to accelerate out of the extraction aperture 35 and past the electrodes toward the workpiece 90.

As shown in FIG. 2A, one or more pairs of RF biased electrodes 40 are disposed on the chamber wall 31, proximate the extraction aperture 35. The pairs of RF biased electrodes 40 may be constructed of a conductive material, such as graphite or metal. In the embodiment shown in FIG. 2A, each pair of RF biased electrodes 40 includes a first RF biased electrode 40a disposed above the extraction aperture 35 and a second RF biased electrode 40b disposed below the extraction aperture 35. Each RF biased electrode may have a width of, for example, 1-5 cm. A plurality of pairs of RF biased electrodes 40 may be disposed along the length of the extraction aperture 35. In some embodiments, between 3 and 10 pairs of RF biased electrodes 40 are disposed proximate the extraction aperture 35, although any number of pairs may be employed.

In this embodiment, the pairs of RF biased electrodes 40 are electrically isolated from the chamber wall 31, such as by a dielectric material 41, which is disposed between the chamber wall 31 and the RF biased electrodes 40. The dielectric material 41 may be disposed on the interior of the plasma chamber 30. The dielectric material 41 may be disposed on the chamber wall 31 so as to completely surround the extraction aperture 35, as shown in FIG. 2A. In other embodiments, the dielectric material 41 may only be disposed on the chamber wall 31 in these regions where RF biased electrodes 40 are disposed. FIG. 2B shows a cross section of the chamber wall 31, taken along line BB, according to one embodiment. As shown in FIG. 2B, the first RF biased electrode 40a and the second RF biased electrode 40b are disposed on the dielectric material 41 on opposite sides of the extraction aperture 35, wherein the sides of the extraction aperture 35 are defined as those regions disposed along the length of the extraction aperture 35. By virtue of the dielectric material 41, the RF biased electrodes 40 are electrically isolated from the chamber wall 31.

In one embodiment, exactly one of the first RF biased electrode 40a and the second RF biased electrode 40b in each pair of RF biased electrodes 40 is in electrical communication with a RF bias power supply 50. In this embodiment, the other one of the first RF biased electrode 40a and the second RF biased electrode 40b in each pair of RF biased electrodes 40 is coupled to the extraction voltage ($V_{ext}$). This may be achieved by coupling the second RF biased electrode 40b directly to the chamber wall 31. The RF bias power supply 50 may output a voltage having an oscillating waveform, such as a voltage waveform 300 shown in FIG. 3A, centered about $V_{ext}$. In one configuration, the varying or alternating current (AC) component of the voltage provided by the RF bias power supply 50 may have an amplitude, $V_{bias}$, where $V_{bias}$ may be between 100 and 500V, although other values are within the scope of the disclosure. The amplitude of the AC component of the voltage may be $V_{bias}$, while the amplitude of the constant or direct current (DC) component of the voltage may be $V_{ext}$. In other words, the voltage provided by the RF bias power supply 50 may oscillate between ($V_{ext}-V_{bias}$) and ($V_{ext}+V_{bias}$). Stated differently, the voltage provided by the RF bias power supply 50 may be $V_{ext}+V_{bias}*\sin(2\pi*F_{bias}+\Phi)$ where $V_{ext}$ is the extraction voltage, $V_{bias}$ is the amplitude of the AC component, $F_{bias}$ is the frequency of the AC component and $\Phi$ is the phase of the AC component. In this embodiment, the maximum voltage difference between the first RF biased electrode 40a and the second RF biased electrode 40b is $V_{bias}$. The frequency of this voltage ($F_{bias}$) may be between 2 MHz and 60 MHz, although other frequencies are also within the scope of the disclosure.

In another embodiment, both of the first RF biased electrode 40a and the second RF biased electrode 40b in each pair of RF biased electrodes 40 are in electrical communication with one or more RF bias power supplies 50. For example, the first RF biased electrode 40a may receive a first voltage from the RF bias power supply 50, while the second RF biased electrode 40b may receive a second voltage that is 180° out of phase with the first voltage. For example, the voltage applied to the first RF biased electrode 40a may be the voltage waveform 300 shown in FIG. 3A, while the voltage applied to the second RF biased electrode 40b may be the voltage waveform 310 shown in FIG. 3B. The AC component of the voltage provided by the RF bias power supply 50 may have an amplitude, $V_{bias}$, where $V_{bias}$ may be between 100 and 500V, although other values are within the scope of the disclosure. The voltage provided by the RF bias power supply 50 to the first RF biased electrode 40a may oscillate between ($V_{ext}-V_{bias}$) and ($V_{ext}+V_{bias}$), while the voltage provided to the second RF biased electrode 40b may oscillate between ($V_{ext}+V_{bias}$) and ($V_{ext}-V_{bias}$). Stated differently, the voltage provided to the first RF biased electrode 40a may be $V_{ext}+V_{bias}*\sin(2\pi*F_{bias}+\phi)$ while the voltage provided to the second RF biased electrode 40b may be $V_{ext}-V_{bias}*\sin(2\pi*F_{bias}+\Phi)$. Due the phase difference between these voltages, the maximum voltage between the first RF biased electrode 40a and the second RF biased electrode 40b is $2V_{bias}$, which is twice that of the earlier described embodiment. The frequency of these voltages ($F_{bias}$) may be between 2 MHz and 60 MHz, although other frequencies are also within the scope of the disclosure.

Each pair of RF biased electrodes 40 may operate as a capacitively coupled plasma source, where the varying electrical field between the pair of RF biased electrodes 40 excites the atoms or molecules disposed therebetween, releasing electrons and further ionizing the plasma. Since the area between each pair of RF biased electrodes 40 is small relative to the size of the plasma chamber 30, and the magnitudes of the voltage applied to the RF biased electrodes 40 are small compared to the voltage that applied to the antenna 20, the effect of each pair of RF biased electrodes 40 is localized to the region proximate that pair.

In other words, the main plasma is generated in the plasma chamber 30 using an inductively coupled plasma (ICP) source. This main plasma can be locally altered through the use of a plurality of pairs of RF biased electrodes 40 disposed near the length of the extraction aperture 35, which operate as individually controllable capacitively coupled plasma (CCP) sources.

Returning to FIG. 2A, thirteen pairs of RF biased electrodes 40 are shown. The voltage applied to each pair of RF biased electrodes 40 may be different from that applied to another pair of RF biased electrodes 40. These differences may be differences in the amplitude ($V_{bias}$), frequency ($F_{bias}$) or phase ($\Phi$) of the AC component of the voltage provided to each pair of RF biased electrodes 40. To increase the plasma density, and therefore, the ion density of the extracted ribbon ion beam 60, in a particular region, the voltage, frequency and/or phase of the AC component of the voltage applied to the pair of RF biased electrodes 40 in that region may be altered. For example, increasing the amplitude of the AC component of the voltage ($V_{bias}$) applied to that pair of RF biased electrodes 40 may increase the plasma density in that localized region. This, in turn, may increase the ion density of the extracted ribbon ion beam 60 in that region. Conversely, a small or zero AC component may have no impact on the plasma density in that region, and therefore, no effect on the ion density of the extracted ribbon ion beam 60 in that region.

The previous embodiments disclose pairs of RF biased electrodes 40, where both the first RF biased electrode 40a and the second RF biased electrode 40b are referenced to the same DC voltage, which may be the extraction voltage ($V_{ext}$). Stated differently, the previous embodiments disclose that the voltages applied to the first RF biased electrode 40a and the second RF biased electrode 40b have the same DC component. In this way, the pair of RF biased electrodes 40 does not impart force on the ions in the y-direction. However, in another embodiment, the voltages applied to first RF biased electrode 40a and the second RF biased electrode 40b may not have the same DC component. In one embodiment, this difference in DC component may be introduced by powering one of the RF biased electrodes 40 through a blocking capacitor with variable capacitance. Once immersed in plasma, the RF electrode that is connected to the RF bias power supply 50 through the blocking capacitor will acquire a self-induced DC component, without the use of additional DC power supply.

Specifically, in one embodiment, the first RF biased electrode 40a may be electrically coupled to the RF bias power supply 50, which generates a voltage waveform 300 shown in FIG. 3A, which has a DC component equal to the extraction voltage and a variable AC component. The second RF biased electrode 40b may be coupled to the RF bias power supply 50 through a blocking capacitor. The DC component of the second RF biased electrode 40b will be $V_{sb}$, where $V_{sb}$ is the self-biasing DC voltage. Stated differently, the voltage applied to the second RF biased electrode 40b will be $V_{sb}+V_{bias}*\sin(2\pi*F_{bias}+\Phi)$. If that self-biasing DC voltage ($V_{sb}$) is equal to the extraction voltage ($V_{ext}$), then no net force in the y-direction is exerted on the ions. However, if the self-biasing DC voltage ($V_{sb}$) applied to the second RF biased electrode 40b is different than the extraction voltage ($V_{ext}$), the ions passing between that pair of RF biased electrodes 40 will be deflected in the y-direction. The ions will be deflected toward the second RF biased electrode 40b if the self-biasing DC voltage ($V_{sb}$) applied to the second RF biased electrode 40b is less that the extraction voltage ($V_{ext}$). Conversely, the ions will be deflected toward the first RF biased electrode 40a if the self-biasing DC voltage ($V_{sb}$) is greater that the extraction voltage ($V_{ext}$). In this way, the deflection of the extracted ions can also be locally controlled. Alternatively, the first RF biased electrode 40a may be coupled to the extraction voltage ($V_{ext}$) through a blocking capacitor, while the second RF biased electrode 40b is coupled to the RF bias power supply 50.

The pairs of RF biased electrodes 40 can be used to increase the local plasma density. When a RF bias is applied to the pair of RF biased electrodes 40, a plasma sheath is formed near the first RF biased electrode 40a and the second RF biased electrode 40b. In the sheath, there is a reduction in the density of ions and electrons. In the sheath, ions are accelerated towards the RF biased electrodes 40, strike the RF biased electrodes 40 and generate secondary electrons. Those electrons are accelerated by the plasma sheath and travel toward the bulk plasma with an energy approximately equal to the sheath voltage. Based on the gas pressure and electron-neutral cross-sections, the mean free path for the electrons, i.e. the distance electrons fly before experiencing a collision, can be calculated. If the mean free path is comparable or smaller to the distance between the pair of RF biased electrodes 40, it is likely those electrons will experience collisions and will lead to additional plasma generation. Alternatively, if the mean free path for electrons is much larger than the distance between the pair of RF biased electrodes 40, it is unlikely that electrons experience collisions and it will not lead to additional plasma generation, i.e. bulk plasma density between the pair of RF biased electrodes 40 will not be significantly affected.

The pair of RF biased electrodes 40 may also be used to reduce the plasma density therebetween. When the mean free path is much longer than the distance between electrodes, collisions are unlikely to occur, as described above. Additionally, the RF biased electrodes 40 may be relatively close to each other. When RF voltage is applied to the pair of RF biased electrodes 40, a plasma sheath is created between the pair of RF biased electrodes 40. The thickness of the plasma sheath may be a substantial portion of the distance between the pair of RF biased electrodes 40. In some cases, the thickness of the plasma sheath may be greater than the distance between the pair of RF biased electrodes 40. If this occurs, there may be less density plasma between the pair of RF biased electrodes 40. Thus, by properly selecting the distance between the first RF biased electrode 40a and the second RF biased electrode 40b, and the amplitude of the RF voltage applied to the RF biased electrodes 40, a local decrease of plasma density can also be achieved. Additionally, the density of the feed gas introduced via gas inlet 32 may also affect the plasma density.

Thus, variations in the density of the feed gas, the distance between the pair of RF biased electrodes 40 and the amplitude of the voltage applied to the RF biased electrodes 40 may allow for three different effects. Specifically, based on the selection of these parameters, the localized plasma density may be increased, decreased or unaffected by the RF biased electrodes 40.

Figure 4:
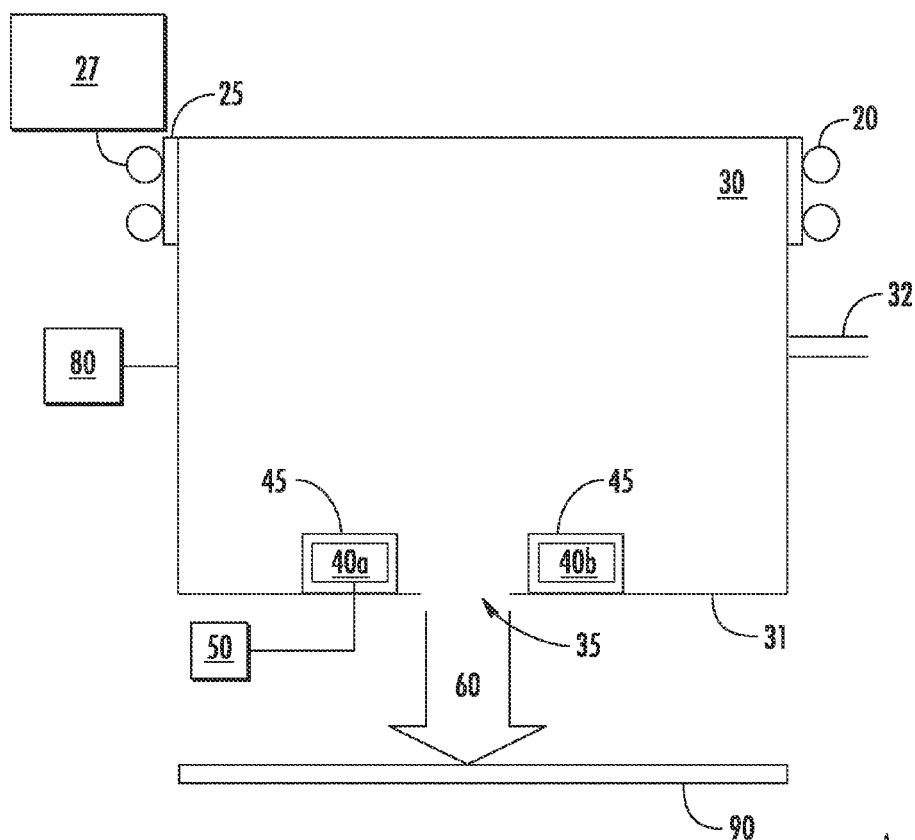
FIG. 4 shows an embodiment using coated RF biased electrodes.

FIG. 4 shows a second embodiment, where the RF biased electrodes 40 are coated or otherwise covered by a dielectric material 45. FIG. 4 shows a cross-section of a plasma chamber 30 in the y-z plane. As shown in FIG. 1, the plasma chamber 30 comprises a dielectric window 25. An antenna 20 is disposed on the dielectric window 25. The antenna 20 is powered by RF power supply 27. Feed gas is introduced into the plasma chamber 30 via the gas inlet 32. The chamber walls of the plasma chamber 30 are biased at an extraction voltage ($V_{ext}$), using an extraction power supply 80. Like FIGS. 2A-2B, the first RF biased electrode 40a and the second RF biased electrode 40b are disposed on chamber wall 31 on opposite sides of the extraction aperture 35, wherein the sides of the extraction aperture 35 are defined as those regions disposed along the length of the extraction aperture 35. Although only one pair is visible, a plurality of pairs of RF biased electrodes 40 may be disposed along the length of the extraction aperture 35. In some embodiments, the dielectric material 45 may be applied to all surfaces of the RF biased electrodes 40. In other embodiments, the dielectric material 45 is only applied to those surfaces that are exposed to the plasma generated in the plasma chamber 30.

Figure 5:
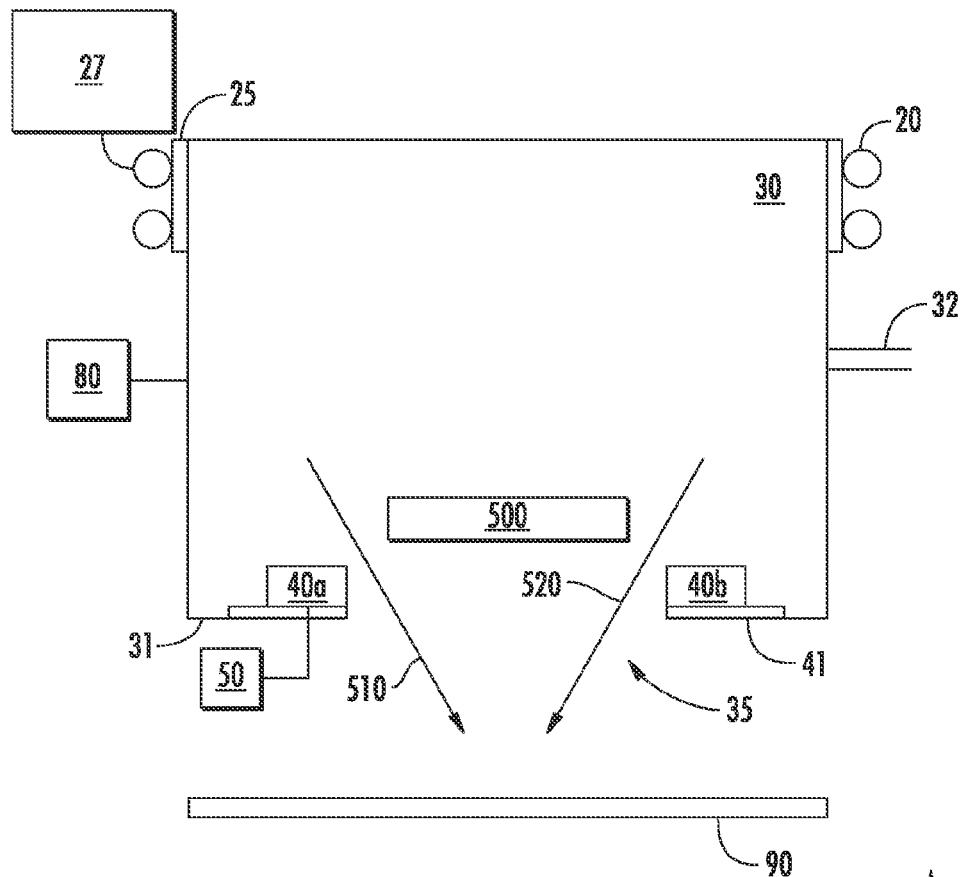
FIG. 5 shows an embodiment of a system using a blocker.

The pairs of RF biased electrodes 40 may also be used in other configurations. For example, in some embodiments, such as that shown in FIGS. 5-6, a blocker 500 is used to create a bimodal distribution of extracted ions. FIG. 5 shows a cross section of a plasma chamber 30 in the y-z plane. The blocker 500 is disposed inside the plasma chamber 30 and is located above the chamber wall 31, proximate the extraction aperture 35. Because the blocker 500 is disposed directly in front of the extraction aperture 35, the ions 510, 520 pass around the blocker 500 to exit the plasma chamber 30. This creates two ion beams, having two different angles of incidence. The position of the blocker 500 relative to the extraction aperture 35 determines the angle of incidence. For example, as the distance between the blocker 500 and the chamber wall 31 increases, the incident angle of the ions decreases (i.e. the path of the ions becomes closer to perpendicular relative to the workpiece 90). Conversely, as the blocker 500 is brought closer to the extraction aperture 35, the angle of incidence increases (i.e. the path of the ions becomes further from perpendicular relative to the workpiece 90).

In one embodiment, the blocker 500 may be made of a conductive material, such as graphite or metal, and biased at the extraction voltage ($V_{ext}$). As described above, the first RF biased electrode 40a and the second RF biased electrode 40b may be disposed on a dielectric material 41, which is in turn disposed on the interior surface of chamber wall 31, surrounding the extraction aperture 35. In this configuration, it is possible to create a plurality of different regions, each of which experiences changing electrical fields. For example, a first region is created between the first RF biased electrode 40a and the blocker 500. The changing electrical field in this region affects the ions 510 passing therethrough. A second region is created between the second RF biased electrode 40b and the blocker 500. The changing electrical field in this region affects the ions 520 passing therethrough. A third region may be created between the first RF biased electrode 40a and the second RF biased electrode 40b at the extraction aperture 35. The changing electrical field in this region affects the ions 510, 520 passing therethrough. To achieve this, the waveform applied to the first RF biased electrode 40a may be similar to the voltage waveform 300 shown in FIG. 3A, while the waveform applied to the second RF biased electrode 40b may be similar to the voltage waveform 310 shown in FIG. 3B. As described above, a plurality of pairs of RF biased electrodes 40 may be disposed proximate the length of the extraction aperture 35. Each pair of RF biased electrodes 40 may be independently controlled and separately powered as described above.

In another embodiment, the voltage applied to the first RF biased electrode 40a is the same as that applied to the second RF biased electrode 40b. In this embodiment, a first changing electrical field is created between the first RF biased electrode 40a and the blocker 500, affecting ions 510. A second changing electrical field is created between the second RF biased electrode 40b and the blocker 500, affecting ions 520. However, in this embodiment, there is no changing electrical field created between the first RF biased electrode 40a and the second RF biased electrode 40b.

In a variation of FIG. 5, the RF biased electrodes 40 may be coated with a dielectric material 45, as shown in FIG. 4.

Figure 6:
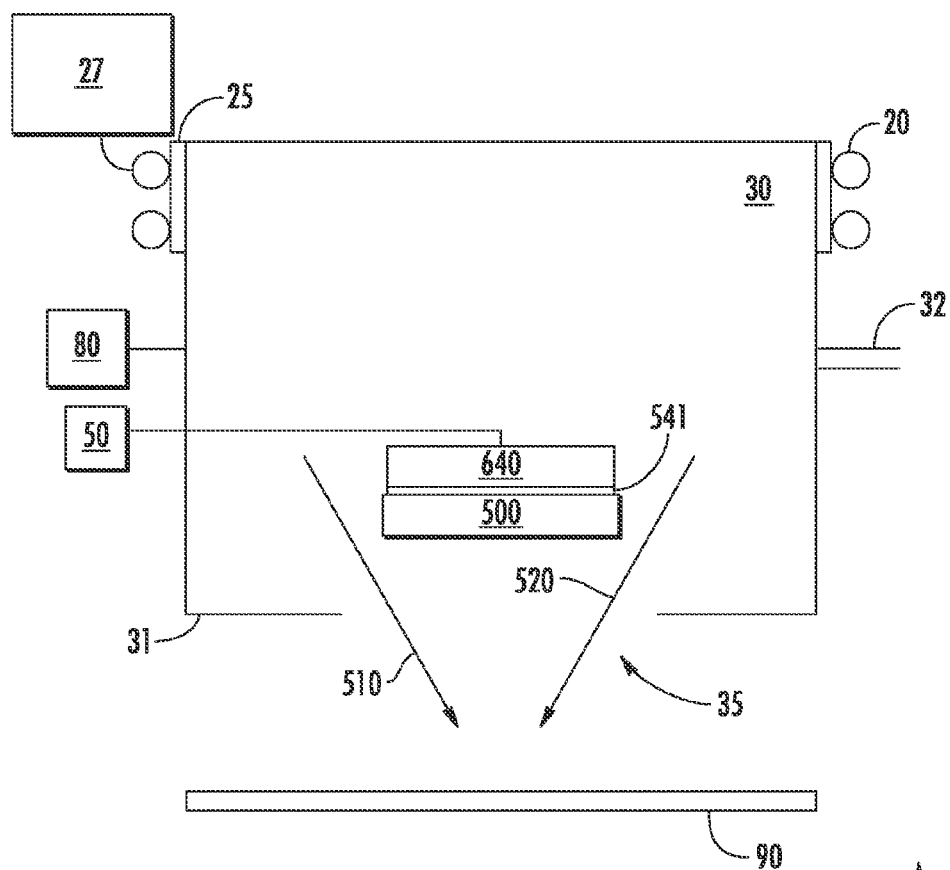
FIG. 6 shows a second embodiment of a system using a blocker.

In another embodiment, RF biased electrodes 640 may be disposed on the blocker 500, as shown in FIG. 6. In this embodiment, the RF biased electrodes 640 are disposed on the blocker 500. The chamber wall 31 serves as a second RF biased electrode to create the pair of RF electrodes. In some embodiments, the blocker 500 may be made of a conductive material, such as graphite or metal. In other embodiments, the blocker 500 may be made or a dielectric material, such as quartz. The blocker 500 may be biased at the extraction voltage ($V_{ext}$). In the event that the blocker 500 is made from a conductive material, a dielectric material 541 may be disposed on the blocker 500, to electrically isolate the blocker 500 from the RF biased electrodes 640. If the blocker 500 is made from a dielectric material, a separate dielectric material 541 may not be used. The chamber wall 31 is biased at the extraction voltage ($V_{ext}$) and serves as the second electrode in the pairs of RF biased electrodes 640. In this configuration, it is possible to create two different regions, each of which experiences changing electrical fields. For example, a first region is created between the RF biased electrode 640 and the chamber wall 31 disposed to the left of the extraction aperture 35. The changing electrical field in this region affects the ions 510 passing therethrough. A second region is created between the RF biased electrode 640 and the chamber wall 31 disposed to the right of the extraction aperture 35. The changing electrical field in this region affects the ions 520 passing therethrough. As described above, a plurality of RF biased electrodes 640 may be disposed along the length of the blocker 500, where each may be independently controlled and separately powered. In this way, the electrical field that affects ions 510 and the electrical field that affects ions 520 are the same. Stated differently, the RF biased electrode 640 may have a voltage similar to the voltage waveform 300 shown in FIG. 3A. Since the chamber wall 31 is uniformly biased at the extraction voltage, the changing electrical field between the RF biased electrode 640 and the chamber wall 31 is the same on both sides of the extraction aperture 35.

Furthermore, although FIG. 6 shows the RF biased electrodes 640 disposed on the top of the blocker 500, where the top is defined as the surface away from the extraction aperture 35, other embodiments are also possible. For example, the RF biased electrodes 640 may be disposed on the bottom of the blocker 500, wherein the bottom is defined as the surface facing the extraction aperture 35. In another embodiment, the RF biased electrodes 640 may be disposed on opposite sides of the blocker 500.

As described above, in some variations of this embodiment, the RF biased electrodes 640 may be coated or otherwise covered by a dielectric material 45, as shown in FIG. 4.

In one particular embodiment, the blocker 500 may be made of a conductive material. In this embodiment, the entirety of the blocker 500 may be biased using the voltage waveform 300 shown in FIG. 3A. In other words, the entire blocker 500 would function as a single RF biased electrode, without the inclusion of any additional components. This configuration would serve to enhance the plasma density between the blocker 500 and the chamber wall 31. However, the enhancement to the plasma density would be uniform across the length of the extraction aperture 35.

In some cases, the conductive material of the blocker 500 may be covered by a dielectric material, so that the plasma is not in contact with a conductive surface.

In another embodiment, the embodiments shown in FIG. 5 and FIG. 6 may be combined such that there are RF biased electrodes 40 disposed proximate the extraction aperture 35 on the chamber wall 31, as well as RF biased electrodes 640 disposed on the blocker 500.

Furthermore, some or all of the RF biased electrodes 40 may be coated or otherwise covered with dielectric material 45, as shown in FIG. 4.

As described above, a plurality of pairs of RF biased electrodes 40 are disposed along the length of the extraction aperture 35. These pairs of RF biased electrodes 40 may be powered in a number of different ways. In one embodiment, a separate RF bias power supply 50 is used for each pair of RF biased electrodes. In another embodiment, a single RF bias power supply 50 is used to supply power to all pairs of RF biased electrodes 40. A separate voltage divider may be used to regulate the power output from the RF bias power supply 50 to provide an appropriate voltage to each pair of RF biased electrodes 40. In some embodiments, the RF power supply 27 may also serve as the RF bias power supply 50.

By disposing a plurality of pairs of RF biased electrodes along the length of the extraction aperture 35, the plasma density, and therefore the ion density of the extracted ribbon ion beam 60 may be controlled. For example, in some cases, the extracted ribbon ion beam 60 may nominally have a greater ion density near its center than near its edges. By selectively applying RF voltages to the plurality of RF biased electrodes 40, this non-uniformity may be reduced or eliminated. For example, a first pair of RF biased electrodes 40 disposed near the end of the extraction aperture 35 may be energized with a first output voltage having a first AC component. A second pair of RF biased electrodes 40 disposed near the center of the extraction aperture 35 may be energized with a second output voltage having a second AC component, where the second AC component is smaller in amplitude than the first AC component. The third pair of RF biased electrodes 40 disposed between the first pair and the second pair may be energized by a third output voltage having a third AC component, which may have an amplitude between that of the first AC component and the second AC component.

Additionally, the embodiments of FIGS. 5-6 also allow for the control and tuning of the angle of incidence and angular spread of ions 510, 520. This change in ion angle of incidence and angular spread may be achieved without moving the blocker 500. By varying the RF power applied to the RF biased electrodes 40, the localized plasma density between the blocker 500 and the RF biased electrodes 40 may be modulated. This modulation of the localized plasma density may cause the plasma boundary shape and, consequently, the ion angle of incidence and angular spread, to vary. The obtained angles of incidence may depend on the aperture size and plasma density (i.e. plasma sheath thickness). For example, large angular spread at a certain mean angle of incidence may be obtained when the plasma meniscus is bulging due to very high RF power, as compared to a flat plasma meniscus that may be obtained at some lower RF power.

In some embodiments, by changing the RF bias power applied to the RF biased electrodes 40, which changes the local plasma density at the extraction aperture 35, approximately a 30% variation in beam mean angle of incidence may be achieved. In other words, the path of ions 510, 520 can be manipulated by changing the RF bias power supplied to the RF biased electrodes 40. Through the use of RF biased electrodes 40, as shown in FIGS. 5-6, the local plasma density at the extraction aperture can be modified by RF discharges, which causes local deviation in ion angle of incidence.

Specifically, in FIG. 5, the power levels of the RF voltage applied to the first RF biased electrodes 40a and second RF biased electrodes 40b determine the localized plasma density between the blocker 500 and the RF biased electrodes 40 on either side of the extraction aperture 35. As such, the power level applied to first RF biased electrode 40a determines the angle of incidence of ions 510 passing between the blocker 500 and the first RF biased electrode 40a. The power level applied to second RF biased electrode 40b determines the angle of incidence of ions 520 passing between the blocker 500 and the second RF biased electrode 40b.

In FIG. 6, the power level of the RF voltage applied to the RF biased electrode 640 disposed on the blocker 500 determines the localized plasma density between the blocker 500 and the chamber wall 31 on either side of the extraction aperture 35. As such, the power level applied to RF biased electrode 640 determines the angle of incidence of ions 510 passing between the blocker 500 and the left side of chamber wall 31 and also determines the angle of incidence of ions 520 passing between the blocker 500 and the right side of chamber wall 31.

In some embodiments, the RF bias power supply 50 may be in communication with a controller 700. The controller 700 may supply control signals to the RF bias power supply 50, which determines the voltage to be applied to each pair of RF biased electrodes 40.

Figure 7A:
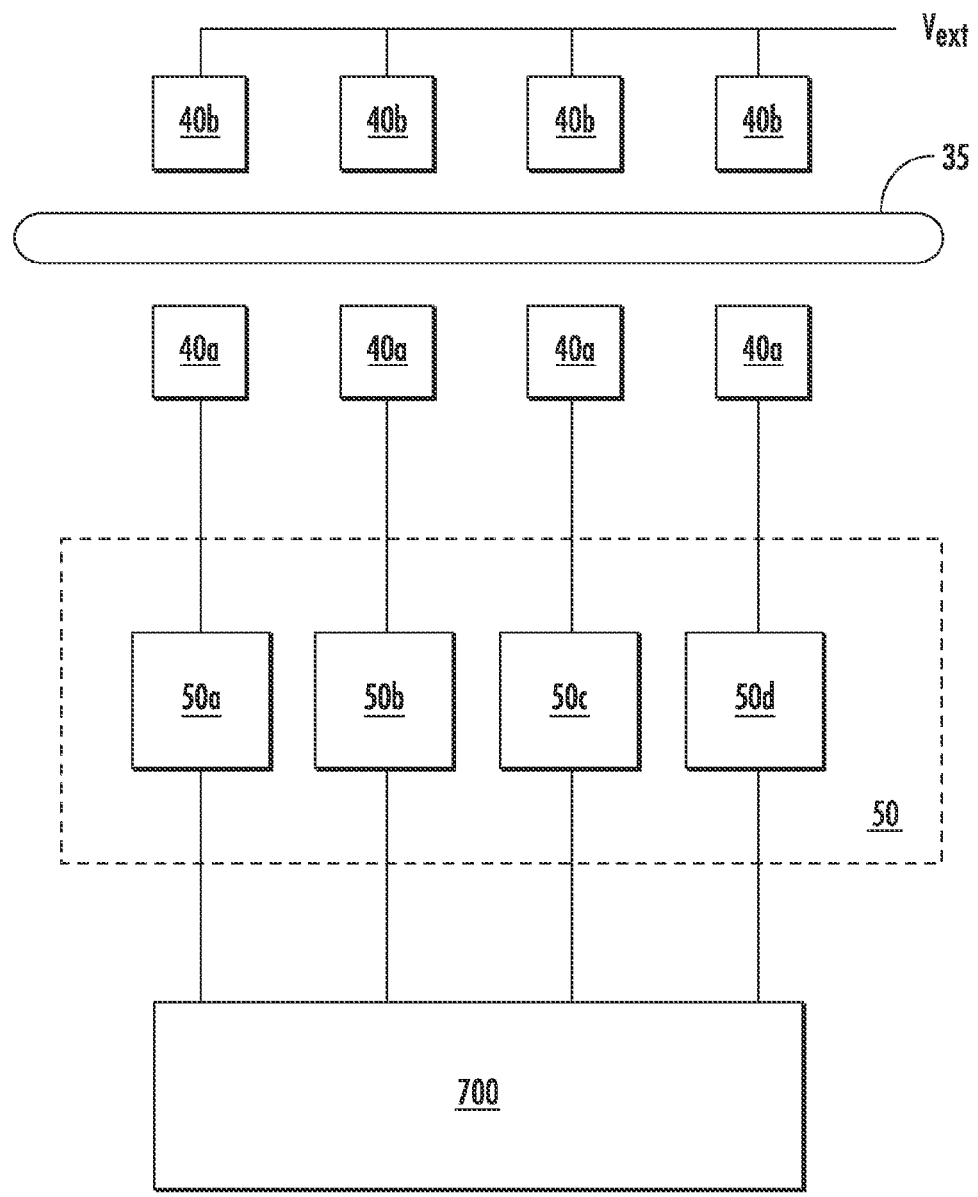
FIGS. 7A-7B show different embodiments using a controller with the RF bias power supply.

In some embodiments, such as the one shown in FIG. 7A, the RF bias power supply 50 may be a plurality of independent RF bias power supplies 50a-50d, where the controller 700 controls each independent RF bias power supply 50a-50d separately. In this embodiment, the independent RF bias power supplies 50a-50d may each supply a voltage to a respective first RF biased electrode 40a. The second RF biased electrodes 40b may be connected to $V_{ext}$. In another embodiment, a second plurality of independent RF bias power supplies (not shown) may be used to each provide power to a respective one of the second RF biased electrodes 40b.

Figure 7B:
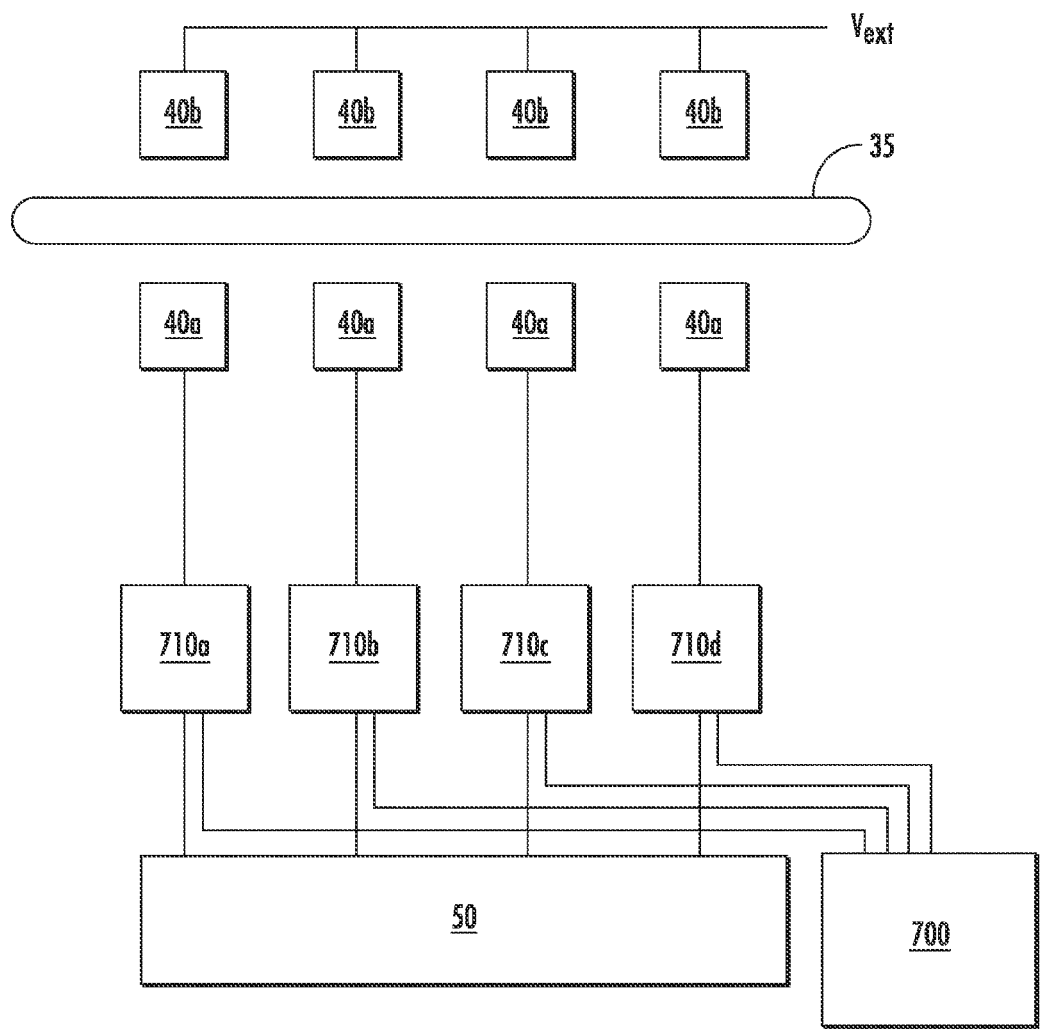

In another embodiment, shown in FIG. 7B, a single RF bias power supply 50 may be used, where the output from that RF bias power supply 50 is distributed to each first RF biased electrode 40a. In this embodiment, voltage dividers 710a-d may be disposed between a respective first RF biased electrode 40a and the RF bias power supply 50. The controller 700 may regulate the amplitude of the RF bias voltage applied to each first RF biased electrode 40a by controlling the voltage dividers 710a-d. The second RF biased electrodes 40b may be connected to $V_{ext}$. In another embodiment, a second plurality of voltage dividers (not shown) may be used to each provide power to a respective one of the second RF biased electrodes 40b.

The controller 700 may provide control signals to the RF bias power supply 50 and/or voltage dividers 710a-d based on a predetermined or preprogrammed configuration. In another embodiment, the controller 700 may be part of a closed control loop, where current monitors (not shown), such as Faraday sensors are used to measure the ion density of the extracted ribbon ion beam 60 along its length. This information may be supplied to the controller 700, which uses this monitored current information to control the RF bias power supply 50 and/or voltage dividers 710a-d.

In the embodiments of FIG. 5-6, the controller 700 may also be used to control or modify the angle of incidence of ions 510, 520 by varying the control signals supplied to RF bias power supply 50. As described above, greater RF power levels may result in larger angles of incidence than lesser RF power levels. Externally disposed current sensors may be used to determine the resulting angle of incidence and provide feedback to the controller 700 to provide closed loop control of the angle of incidence.

The use of pairs of RF biased electrodes 40 enables the local control and manipulation of the plasma density near the extraction aperture 35. This may be used to improve the uniformity of the extraction ribbon ion beam 60. This may be done by increasing the localized plasma density in those regions where the ion density of the plasma within the plasma chamber 30 is not equal to other regions. For example, localized plasma density may be increased near the ends of the extraction aperture 35, as compared to the center of the extraction aperture 35. In addition, the use of RF biased electrodes 40 allows the manipulation of the extracted ribbon ion beam 60 to create a desired non-uniformity. Further, in embodiments that utilize a blocker 500, the RF biased electrodes 40 can be energized so as to vary the angle of incidence of the extracted ions 510, 520. Thus, the use of RF biased electrodes 40 disposed near the extraction aperture 35 allows finer control over the extracted ribbon ion beam 60 than would be possible through the use of only a traditional antenna or other ICP source.

Furthermore, the term ion beam uniformity is not intended to depict that the ion density of the extracted ribbon ion beam 60 is equal in all regions. Indeed, in some embodiments, it may be beneficial to have unequal ion density distribution. The embodiments described herein may be used to achieve an equal ion density or any desired unequal ion density.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma chamber, comprising:
   a power source to generate a plasma within the plasma chamber;
   a chamber wall having an extraction aperture through which ions from the plasma are extracted, the chamber wall biased at an extraction voltage;
   a pair of RF biased electrodes disposed on an interior of the chamber wall on opposite sides of the extraction aperture; and
   a RF bias power supply to supply a first RF voltage to a first of the pair of RF biased electrodes.

2. The plasma chamber of claim 1, wherein the first RF voltage comprises a DC component and an AC component, and the DC component is equal to the extraction voltage applied to the chamber wall.

3. The plasma chamber of claim 1, wherein the extraction aperture has a length and a width, wherein the length is greater than the width, further comprising a plurality of pairs of RF biased electrodes disposed on the interior of the chamber wall on opposite sides of the extraction aperture along the length of the extraction aperture, wherein a first of each of the plurality of pairs of RF biased electrodes is in communication with the RF bias power supply.

4. The plasma chamber of claim 1, wherein a second of the pair of RF biased electrodes is biased at the extraction voltage.

5. The plasma chamber of claim 1, wherein a second of the pair of RF biased electrodes is coupled to a RF power supply and is energized by a second RF voltage.

6. The plasma chamber of claim 5, wherein the second RF voltage is out of phase with the first RF voltage.

7. The plasma chamber of claim 1, wherein the second of the pair of RF biased electrodes is coupled to the RF bias power supply through a blocking capacitor such that a DC component of the second of the pair of RF biased electrodes is able to self-bias.

8. The plasma chamber of claim 1, further comprising a blocker disposed within the plasma chamber proximate the extraction aperture, wherein the blocker is biased at the extraction voltage.

9. The plasma chamber of claim 8, wherein a power level of the first RF voltage determines an angle of incidence of ions passing between the blocker and the first of the pair of RF biased electrodes.

10. The plasma chamber of claim 8, wherein a second of the pair of RF biased electrodes is coupled to a RF power supply and is energized by a second RF voltage, wherein the second RF voltage is out of phase with the first RF voltage.

11. The plasma chamber of claim 1, wherein the pair of RF biased electrodes is covered by a dielectric material.

* * * * *